(12) United States Patent
Wei et al.

(10) Patent No.: US 12,144,106 B2
(45) Date of Patent: Nov. 12, 2024

(54) ELECTRONIC DEVICE

(71) Applicant: TPK Auto Tech (Xiamen) Limited, Fujian (CN)

(72) Inventors: Li Hua Wei, Longyan (CN); Ming Hsiang Lin, Taipei (TW); Shih Hao Chen, Hsinchu County (TW); Cai Jin Ye, Xiamen (CN)

(73) Assignee: TPK Auto Tech (Xiamen) Limited, Fujian (CN)

( * ) Notice: Subject to any disclaimer, the term of this patent is extended or adjusted under 35 U.S.C. 154(b) by 0 days.

(21) Appl. No.: 17/738,397

(22) Filed: May 6, 2022

(65) Prior Publication Data

US 2023/0363086 A1  Nov. 9, 2023

(51) Int. Cl.
H05K 1/02 (2006.01)
H05K 1/03 (2006.01)
H05K 1/11 (2006.01)
H05K 1/18 (2006.01)

(52) U.S. Cl.
CPC ......... H05K 1/0268 (2013.01); H05K 1/0218 (2013.01); H05K 1/111 (2013.01); H05K 1/0393 (2013.01); H05K 1/18 (2013.01); H05K 2201/0723 (2013.01)

(58) Field of Classification Search
CPC .... H05K 1/0268; H05K 1/0218; H05K 1/111; H05K 2201/0723
See application file for complete search history.

(56) References Cited

U.S. PATENT DOCUMENTS

| 7,180,012 B2 * | 2/2007 | Tsuneoka | H01L 23/3121 257/E23.125 |
| 9,508,624 B2 | 11/2016 | Yoo | |
| 2009/0038839 A1 * | 2/2009 | Hashimoto | H05K 1/0218 156/60 |
| 2019/0261503 A1 * | 8/2019 | Haruna | H01R 4/04 |

FOREIGN PATENT DOCUMENTS

| TW | 201405391 A | 2/2014 |
| TW | 202025868 A | 7/2020 |
| TW | 202025869 A | 7/2020 |
| TW | 202106514 A | 2/2021 |

* cited by examiner

Primary Examiner — Ishwarbhai B Patel
(74) Attorney, Agent, or Firm — Cooper Legal Group, LLC

(57) ABSTRACT

An electronic device includes a circuit board, a shielding member, and a testing pin. The circuit board includes a grounding area. The shielding member is located on a side of the circuit board and includes a shielding layer and an insulating layer. The shielding layer is electrically connected to the grounding area. The insulating layer is located on a side of the shielding layer away from the circuit board. The testing pin is disposed on the circuit board and electrically connected to the shielding layer.

20 Claims, 4 Drawing Sheets

ELECTRONIC DEVICE

BACKGROUND

Technical Field

The present disclosure relates to an electronic device.

Description of Related Art

As to whether the function of the electromagnetic shielding tape (EMI tape) is normal (that is, whether it is connected to the grounding area of the circuit board), the industry currently adopts a destructive testing method. Specifically, the EMI tape includes an insulating layer and a metal shielding layer stacked on each other. When measuring the conductivity between the EMI tape and the grounding area of the circuit board, it is necessary to scrape off the insulating layer to measure the impedance between the metal shielding layer and the grounding area.

However, the aforementioned destructive testing method will damage the appearance of the circuit board, which is not allowed for qualified products. Moreover, there is also a risk of exposure of the circuits on the circuit board, thereby affecting the performance of the circuit board.

Accordingly, how to provide an electronic device to solve the aforementioned problems becomes an important issue to be solved by those in the industry.

SUMMARY

An aspect of the disclosure is to provide an electronic device that can efficiently solve the aforementioned problems.

According to an embodiment of the disclosure, an electronic device includes a circuit board, a shielding member, and a testing pin. The circuit board includes a grounding area. The shielding member is located on a side of the circuit board and includes a shielding layer and an insulating layer. The shielding layer is electrically connected to the grounding area. The insulating layer is located on a side of the shielding layer away from the circuit board. The testing pin is disposed on the circuit board and electrically connected to the shielding layer.

In an embodiment of the disclosure, the circuit board further includes a pin area. The testing pin is located in the pin area.

In an embodiment of the disclosure, the shielding member further includes a conductive layer. The conductive layer is located between the circuit board and the shielding layer.

In an embodiment of the disclosure, the circuit board further includes a circuit layer. The circuit layer includes a testing circuit. The testing pin is located at a distal end of the testing circuit.

In an embodiment of the disclosure, the testing circuit is located in the grounding area.

In an embodiment of the disclosure, the circuit board further includes a contact pad. The contact pad is located in the grounding area and electrically contacts the testing circuit and the shielding layer.

In an embodiment of the disclosure, the circuit layer further includes a grounding circuit. The grounding circuit and the testing circuit are electrically insulated in the circuit layer.

In an embodiment of the disclosure, the circuit board further includes a pin area. The grounding circuit has a grounding pin located in the pin area. The grounding pin is electrically connected to the shielding layer.

In an embodiment of the disclosure, the circuit board further includes a contact pad. The contact pad is located in the grounding area and electrically contacts the grounding circuit and the shielding layer.

In an embodiment of the disclosure, the electronic device further includes a second testing pin electrically connected to the shielding layer.

In an embodiment of the disclosure, the circuit board further includes a pin area. The second testing pin is located in the pin area.

In an embodiment of the disclosure, the circuit board further includes a circuit layer. The circuit layer includes a testing circuit. The second testing pin is located at a distal end of the testing circuit.

Accordingly, in the electronic device of the present disclosure, the shielding layer of the shielding member is electrically connected to the testing pin disposed on the circuit board. In this way, the inspector can use an open/short detection instrument to test the impedance via the testing pin to confirm the conductivity between the shielding member and the grounding area of the circuit board, so as to effectively solve the problem of damage to the appearance of the circuit board caused by the conventional destructive testing method.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
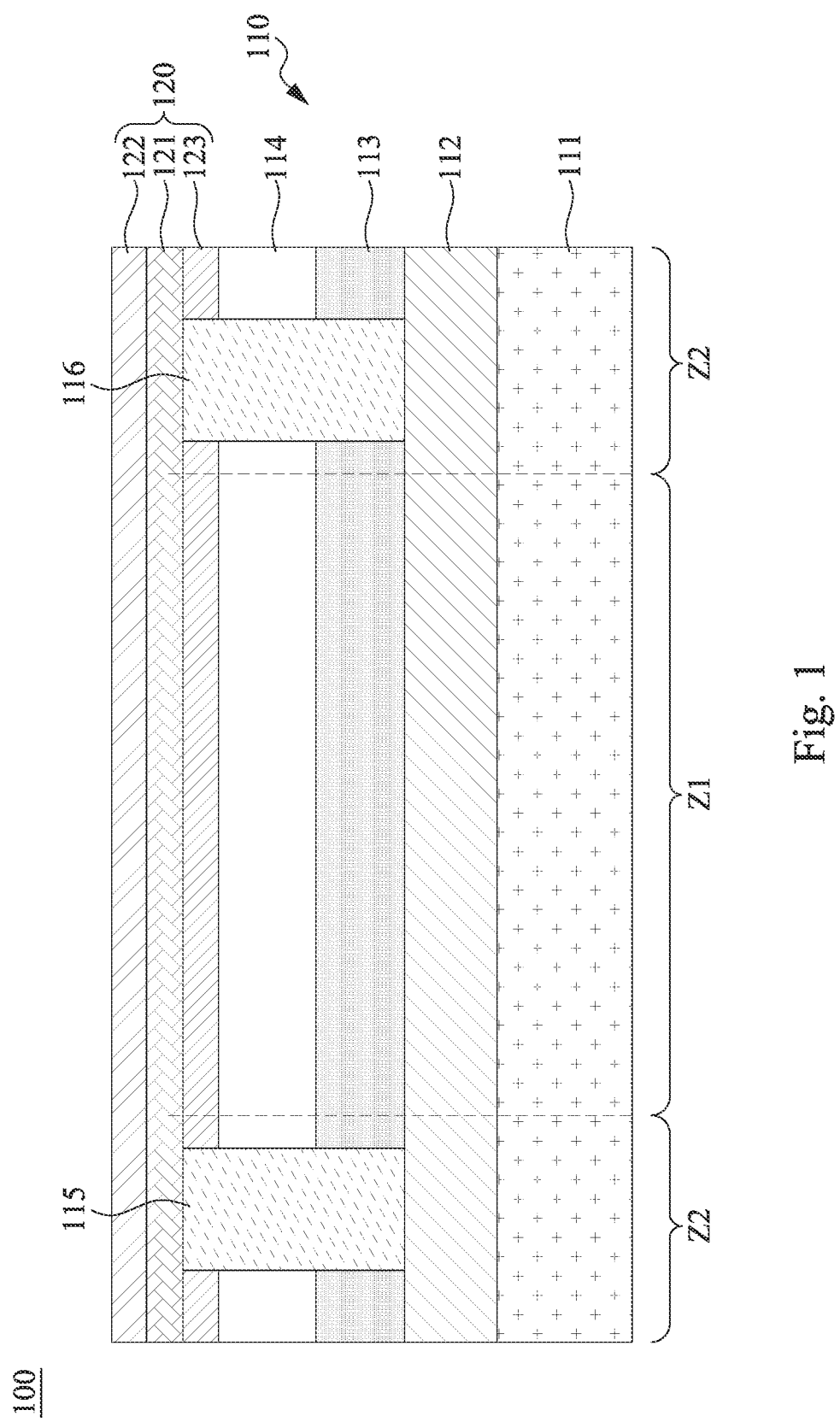
FIG. 1 is a cross-sectional view of an electronic device according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 is a cross-sectional view of an electronic device 100 according to an embodiment of the present disclosure. As shown in FIG. 1, in the present embodiment, the electronic device 100 includes a circuit board 110 and a shielding member 120. The circuit board 110 includes a base layer 111, a circuit layer 112, an adhesive layer 113, and a covering layer 114. Specifically, the circuit board 110 may be a flexible circuit board. The circuit layer 112 is disposed on the base layer 111. The covering layer 114 is adhered to the circuit layer 112 through the adhesive layer 113. The shielding member 120 is located on a side of the circuit board 110 and includes a shielding layer 121, an insulating layer 122, and a conductive layer 123. The insulating layer 122 is located on a side of the shielding layer 121 away from the circuit board 110. The conductive layer 123 is located on a side of the shielding layer 121 close to the circuit board 110 (i.e., between the circuit board 110 and the shielding layer 121), and is attached to the covering layer 114. The shielding member 120 is used to protect the circuit layer 112 of the circuit board 110 from electromagnetic interference (EMI), so as to prevent the circuit board 110 from malfunctioning when the circuit board 110 is near a radio frequency electromagnetic field generated by another electronic device.

In some embodiments, the material of the circuit layer 112 includes copper, but the present disclosure is not limited in this regard.

In some embodiments, the material of the covering layer 114 includes plastics. For example, the plastics include polyimide (PI), but the present disclosure is not limited in this regard.

Figure 2:
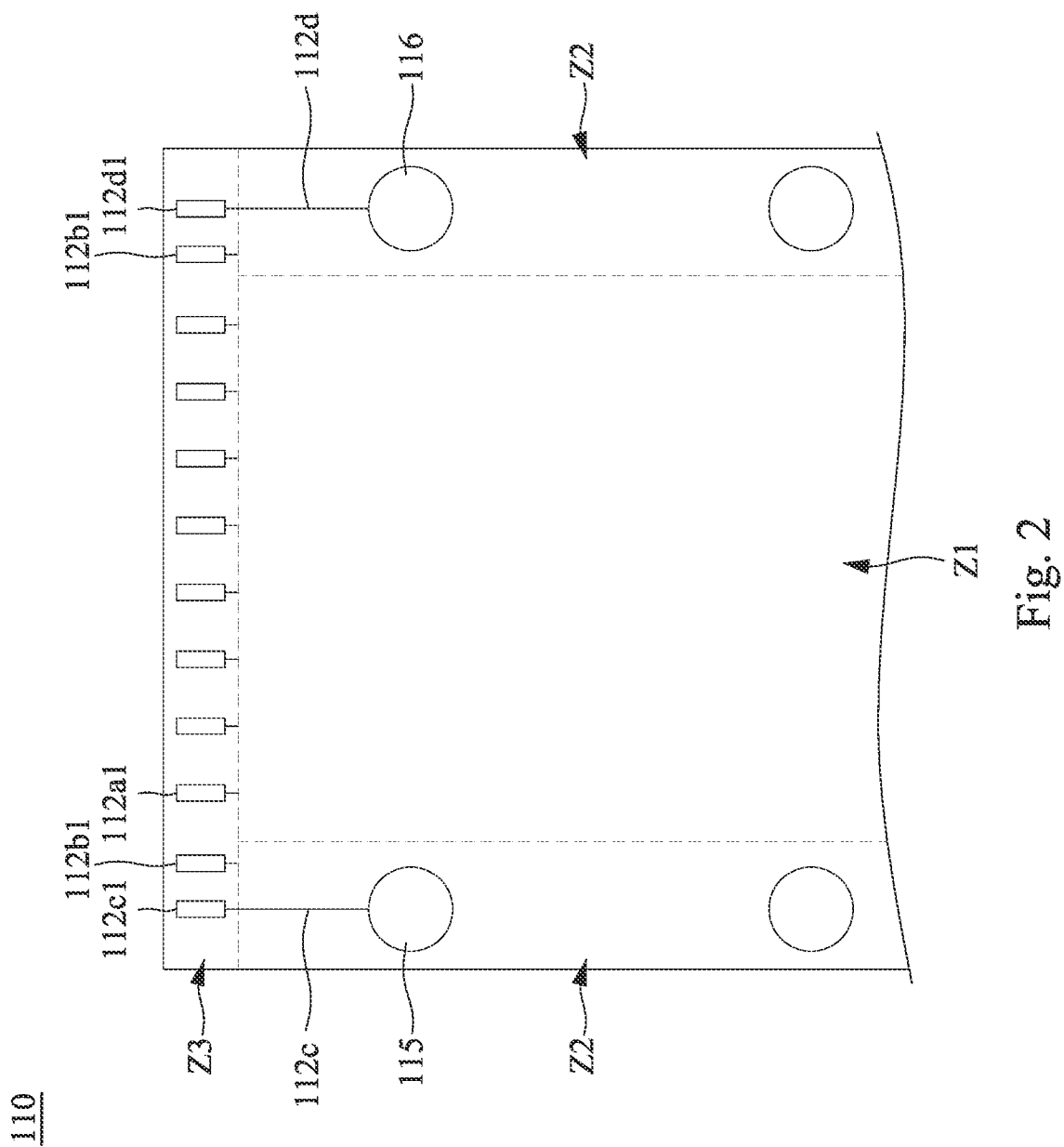
FIG. 2 is a schematic diagram of a circuit board according to an embodiment of the present disclosure.

Reference is made to FIG. 2. FIG. 2 is a schematic diagram of the circuit board 110 according to an embodiment of the present disclosure. As shown in FIGS. 1 and 2, in the present embodiment, the circuit board 110 includes a wiring area Z1 and a grounding area Z2 located on two, opposite sides of the wiring area Z1. The shielding layer 121 is electrically connected to the grounding area Z2. Further, the electronic device 100 further includes testing pins 112c1, 112d1. The testing pins 112c1, 112d1 are disposed on the circuit board 110 and are electrically connected to the shielding layer 121. An inspector can use an open/short detection instrument to test the impedance via the testing pins 112c1, 112d1 to confirm the conductivity between the shielding member 120 and the grounding area Z2 of the circuit board 110, so as to effectively solve the problem of damage to the appearance of the circuit board 110 caused by the conventional destructive testing method.

Figure 3:
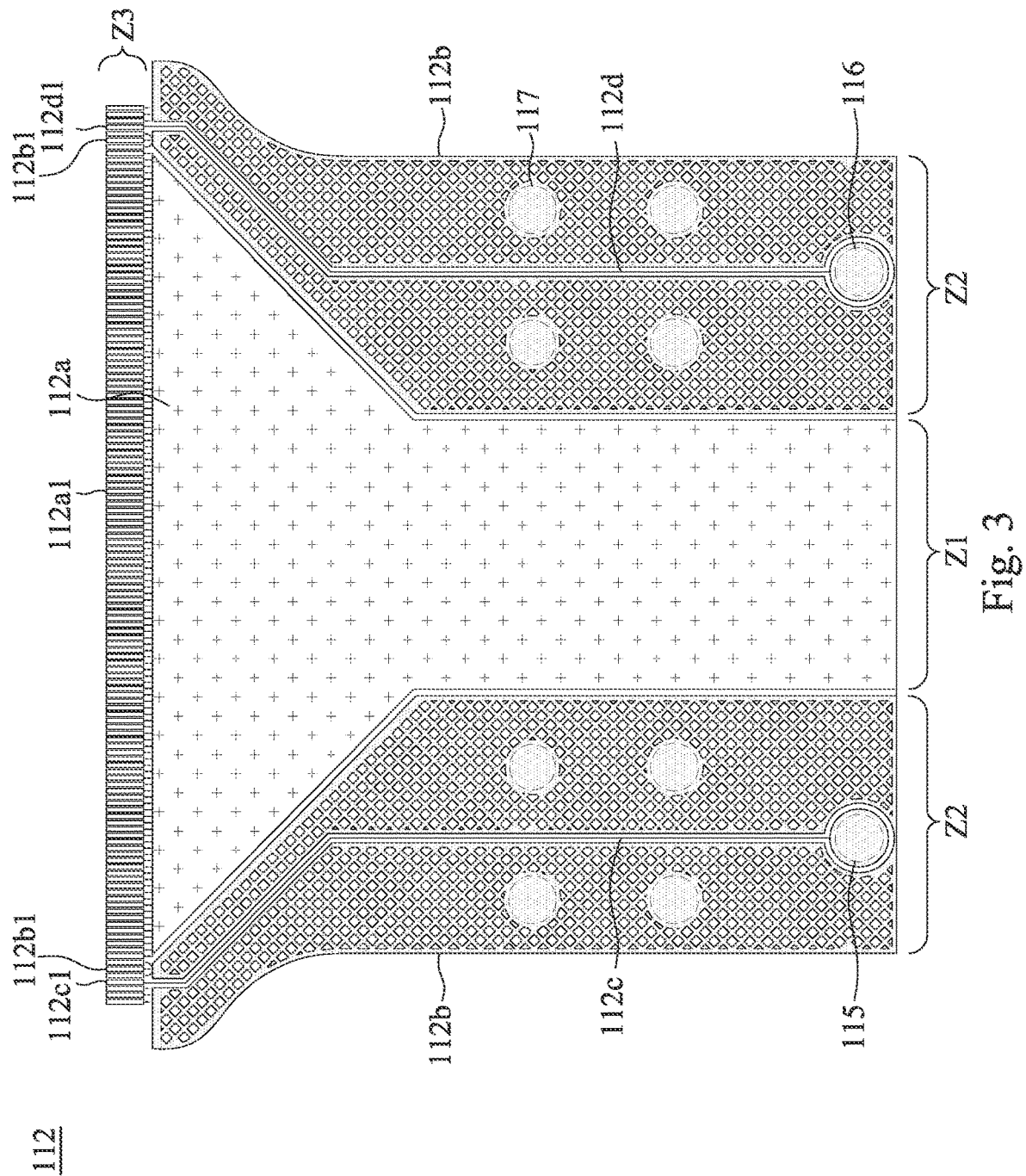
FIG. 3 is a schematic diagram of a circuit layer of the circuit board according to an embodiment of the present disclosure.

Reference is made to FIG. 3. FIG. 3 is a schematic diagram of the circuit layer 112 of the circuit board 110 according to an embodiment of the present disclosure. As shown in FIG. 3, in the present embodiment, the circuit layer 112 of the circuit board 110 includes a signal circuit 112a, a grounding circuit 112b, and testing circuits 112c, 112d. The signal circuit 112a is located in the wiring area Z1. The grounding circuit 112b and the testing circuits 112c, 112d are located in the grounding area Z2. The grounding circuit 112b is electrically insulated from the testing circuits 112c, 112d in the circuit layer 112. Specifically, the grounding circuit 112b and the testing circuits 112c, 112d are separated in the circuit layer 112 without being in direct contact.

In the present embodiment, the testing circuits 112c, 112d are surrounded by the grounding circuit 112b, but the present disclosure is not limited in this regard.

As shown in FIG. 2, the circuit board 110 further includes a pin area Z3. The pin area Z3 is located on the same side of the wiring area Z1 and the grounding area Z2. A distal end of the signal circuit 112a has signal pins 112a1 located in the pin area Z3. A distal end of the grounding circuit 112b has a grounding pin 112b1 located in the pin area Z3. Distal ends of the testing circuits 112c, 112d have respectively testing pins 112c1, 112d1 located in the pin area Z3.

As shown in FIGS. 2 and 3, in the present embodiment, the circuit board 110 further includes contact pads 115, 116 (indicated by dotted lines in FIG. 3). The contact pad 115 is located in the grounding area Z2 and electrically contacts the testing circuit 112c and the shielding layer 121. The contact pad 116 is located in the grounding area Z2 and electrically contacts the testing circuit 112d and the shielding layer 121. In other words, the contact pads 115, 116 pass through the adhesive layer 113, the covering layer 114, and the conductive layer 123 to contact the shielding layer 121. In this way, the inspector can use the aforementioned open/short detection instrument to test the impedance via the testing pins 112c1, 112d1 to confirm the conductivity between the shielding member 120 and the grounding area Z2 of the circuit board 110, so as to effectively solve the problem of damage to the appearance of the circuit board 110 caused by the conventional destructive testing method.

It should be noted that, although in the embodiment shown in FIG. 3, the wiring area Z1 is located between the grounding area Z2 (that is, the grounding area Z2 is located on both sides of the wiring area Z1), but the present disclosure is not limited in this regard. In practical applications, the grounding area Z2 can also be located between the wiring area Z1 (that is, the wiring area Z1 is located on both sides of the grounding area Z2).

Figure 4:
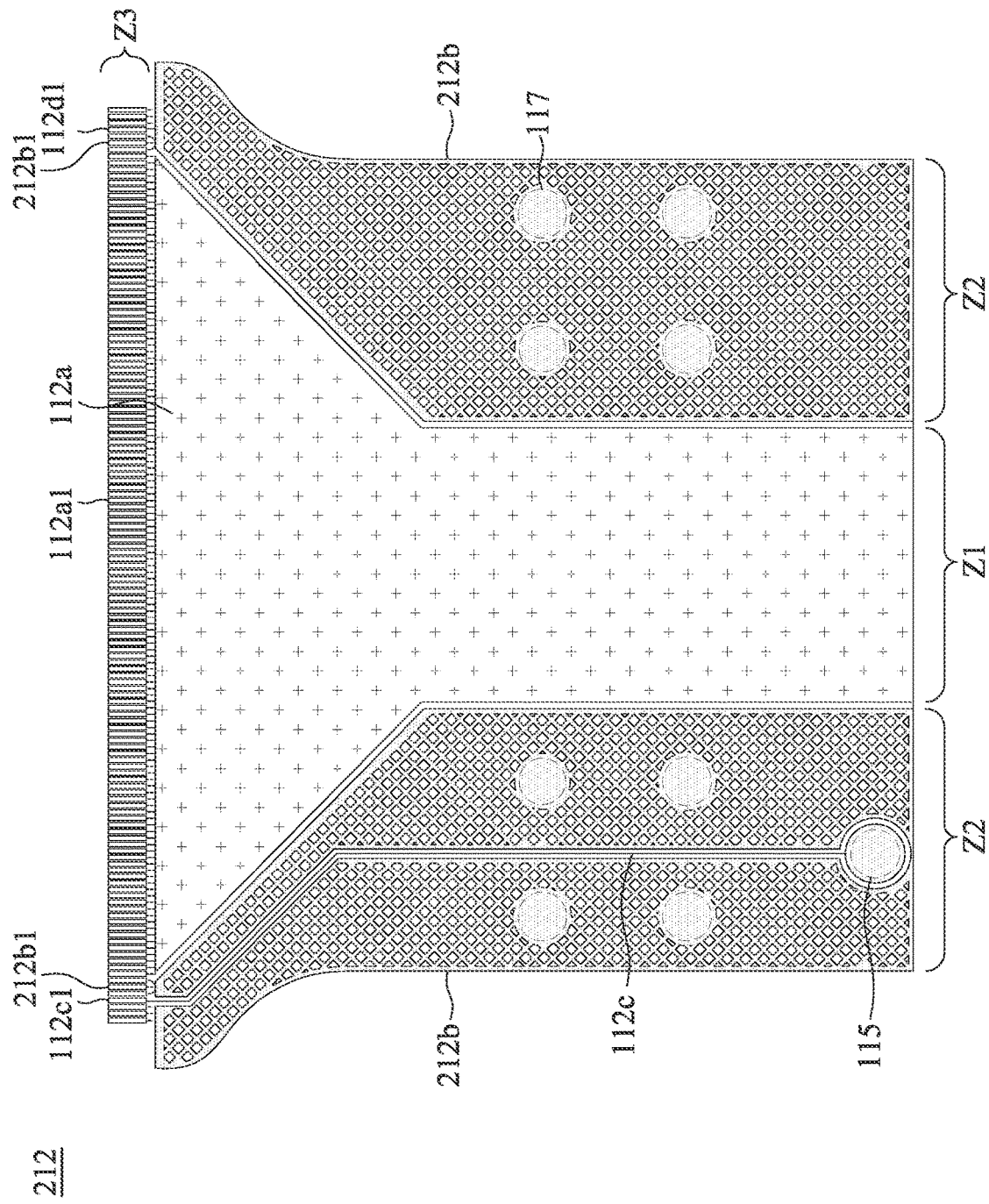
FIG. 4 is a schematic diagram of a circuit layer of the circuit board according to another embodiment of the present disclosure.

Reference is made to FIG. 4. FIG. 4 is a schematic diagram of a circuit layer 212 of the circuit board 110 according to another embodiment of the present disclosure. As shown in FIG. 4, the present embodiment modifies the circuit layer 112 shown in FIG. 3 and provides the circuit layer 212 after modification. In detail, the circuit layer 212 of the present embodiment eliminates the testing circuit 112d in the circuit layer 112 and the contact pad 116 in contact therewith, and provides a modified grounding circuit 212b. In addition, the circuit board 110 further includes a contact pad 117 (indicated by dotted lines in FIG. 4). The contact pad 117 is located in the grounding area Z2 and electrically contacts the grounding circuit 212b and the shielding layer 121 (with reference to FIG. 1). In other words, the contact pad 117 passes through the adhesive layer 113, the covering layer 114, and the conductive layer 123 to contact the shielding layer 121. In this way, the inspector can use the aforementioned open/short detection instrument to test the impedance via the testing pin 112c1 and the grounding pin 212b1 of the grounding circuit 212b to confirm the conductivity between the shielding member 120 and the grounding area Z2 of the circuit board 110, so as to effectively solve the problem of damage to the appearance of the circuit board 110 caused by the conventional destructive testing method.

According to the foregoing recitations of the embodiments of the disclosure, it can be seen that in the electronic device of the present disclosure, the shielding layer of the shielding member is electrically connected to the testing pin(s) disposed on the circuit board. In this way, the inspector can use an open/short detection instrument to test the impedance via the testing pin(s) to confirm the conductivity between the shielding member and the grounding area of the circuit board, so as to effectively solve the problem of damage to the appearance of the circuit board caused by the conventional destructive testing method.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic device, comprising:
a circuit board comprising a grounding area, wherein the grounding area comprises a grounding circuit and a testing circuit electrically insulated from the grounding circuit;
a shielding member located on a side of the circuit board and comprising a shielding layer and an insulating layer, the shielding layer being electrically connected to the grounding area, and the insulating layer being located on a side of the shielding layer away from the circuit board; and
a testing pin disposed on the circuit board and electrically connected to the shielding layer.

2. The electronic device of claim 1, wherein the circuit board further comprises a pin area, and the testing pin is located in the pin area.

3. The electronic device of claim 1, wherein the shielding member further comprises a conductive layer, and the conductive layer is located between the circuit board and the shielding layer.

4. The electronic device of claim 1, wherein the circuit board further comprises a circuit layer, the circuit layer comprises the testing circuit, and the testing pin is located at a distal end of the testing circuit.

5. The electronic device of claim 4, wherein the circuit board further comprises a contact pad, and the contact pad is located in the grounding area and electrically contacts the testing circuit and the shielding layer.

6. The electronic device of claim 4, wherein the circuit layer further comprises the grounding circuit, and the grounding circuit and the testing circuit are electrically insulated in the circuit layer.

7. The electronic device of claim 6, wherein the circuit board further comprises a pin area, the grounding circuit has a grounding pin located in the pin area, and the grounding pin is electrically connected to the shielding layer.

8. The electronic device of claim 7, wherein the circuit board further comprises a contact pad, and the contact pad is located in the grounding area and electrically contacts the grounding circuit and the shielding layer.

9. The electronic device of claim 1, further comprising a second testing pin electrically connected to the shielding layer.

10. The electronic device of claim 9, wherein the circuit board further comprises a pin area, and the second testing pin is located in the pin area.

11. The electronic device of claim 10, wherein the circuit board further comprises a circuit layer, the circuit layer comprises the testing circuit, and the second testing pin is located at a distal end of the testing circuit.

12. The electronic device of claim 1, wherein the circuit board further comprises an adhesive layer and a covering layer over the adhesive layer, and the shielding member further comprises a conductive layer over the covering layer.

13. The electronic device of claim 12, wherein the circuit board further comprises a circuit layer under the adhesive layer and a contact pad contacting the circuit layer and extending through the adhesive layer, the covering layer, and the conductive layer to contact the shielding layer.

14. The electronic device of claim 1, wherein the circuit board further comprises a first contact pad contacting the testing circuit and the shielding layer.

15. The electronic device of claim 1, wherein the circuit board further comprises a second contact pad contacting the grounding circuit.

16. The electronic device of claim 15, further comprising a grounding pin electrically connected to the second contact pad.

17. The electronic device of claim 1, wherein the shielding member further comprises a conductive layer, and the shielding layer is between the insulating layer and the conductive layer.

18. An electronic device, comprising:
a circuit board comprising a grounding area, a circuit layer, and a contact pad, wherein the circuit layer comprises a testing circuit, and the contact pad is located in the grounding area;
a shielding member located on a side of the circuit board and comprising a shielding layer and an insulating layer, the shielding layer being electrically connected to the grounding area, and the insulating layer being located on a side of the shielding layer away from the circuit board, wherein the contact pad electrically contacts the testing circuit and the shielding layer; and
a testing pin disposed on the circuit board and electrically connected to the shielding layer, wherein the testing pin is located at a distal end of the testing circuit.

19. An electronic device, comprising:
a circuit board comprising a grounding area and a circuit layer, wherein the circuit layer comprises a testing circuit and a grounding circuit, and the grounding circuit and the testing circuit are electrically insulated in the circuit layer;
a shielding member located on a side of the circuit board and comprising a shielding layer and an insulating layer, the shielding layer being electrically connected to the grounding area, and the insulating layer being located on a side of the shielding layer away from the circuit board; and
a testing pin disposed on the circuit board and electrically connected to the shielding layer, wherein the testing pin is located at a distal end of the testing circuit.

20. An electronic device, comprising:
a circuit board comprising a grounding area, an adhesive layer, a covering layer over the adhesive layer, a circuit layer under the adhesive layer, and a contact pad;
a shielding member located on a side of the circuit board and comprising a shielding layer and an insulating layer, the shielding member further comprising a conductive layer over the covering layer, the shielding layer being electrically connected to the grounding area, and the insulating layer being located on a side of the shielding layer away from the circuit board, wherein the contact pad contacts the circuit layer and extends through the adhesive layer, the covering layer, and the conductive layer to contact the shielding layer; and
a testing pin disposed on the circuit board and electrically connected to the shielding layer.

* * * * *